United States Patent
Deak et al.

(10) Patent No.: US 10,379,176 B2
(45) Date of Patent: Aug. 13, 2019

(54) SINGLE-CHIP HIGH-MAGNETIC-FIELD X-AXIS LINEAR MAGNETORESISTIVE SENSOR WITH CALIBRATION AND INITIALIZATION COIL

(71) Applicant: MultiDimension Technology Co., Ltd., Zhanjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 125 days.

(21) Appl. No.: 15/549,098

(22) PCT Filed: Feb. 3, 2016

(86) PCT No.: PCT/CN2016/073244
§ 371 (c)(1),
(2) Date: Aug. 4, 2017

(87) PCT Pub. No.: WO2016/124135
PCT Pub. Date: Aug. 11, 2016

(65) Prior Publication Data
US 2018/0246177 A1    Aug. 30, 2018

(30) Foreign Application Priority Data
Feb. 4, 2015    (CN) .......................... 2015 1 0056576

(51) Int. Cl.
*G01R 33/00*    (2006.01)
*G01R 33/09*    (2006.01)

(52) U.S. Cl.
CPC ........ *G01R 33/098* (2013.01); *G01R 33/0011* (2013.01); *G01R 33/0017* (2013.01); *G01R 33/09* (2013.01)

(58) Field of Classification Search
CPC .............. G01R 33/098; G01R 33/0011; G01R 33/0017; G01R 33/09
(Continued)

(56) References Cited

U.S. PATENT DOCUMENTS

| | | | |
|---|---|---|---|
| 2012/0200292 A1* | 8/2012 | Sugihara | G01R 33/093 324/252 |
| 2012/0326715 A1 | 12/2012 | Ide et al. | |
| 2013/0300409 A1* | 11/2013 | Deak | G01R 33/093 324/252 |

FOREIGN PATENT DOCUMENTS

| | | |
|---|---|---|
| CN | 101251558 | 8/2008 |
| CN | 103267955 | 8/2013 |

(Continued)

OTHER PUBLICATIONS

"International Application No. PCT/CN2016/073244, International Search Report and Written Opinion dated Apr. 9, 2016", (Apr. 9, 2016), 14 pgs.

*Primary Examiner* — Melissa J Koval
*Assistant Examiner* — Rahul Maini
(74) *Attorney, Agent, or Firm* — Schwegman Lundberg & Woessner, P.A.

(57) ABSTRACT

A single-chip high-magnetic-field X-axis linear magnetoresistive sensor with a calibration and an initialization coil, comprising a high magnetic field single-chip referenced bridge X-axis magnetoresistive sensor, a calibration coil, and an initialization coil, wherein the calibration coils are planar coils, and the initialization coils are planar or three-dimensional coils. The planar calibration coils and the planar initialization coils can be placed above a substrate and below the magnetoresistive sensor units, between the magnetoresistive sensor units and the soft ferromagnetic flux guides, above the soft ferromagnetic flux guides, or at gaps between the soft ferromagnetic flux guides. The three-dimensional (Continued)

initialization coil is wound around the soft ferromagnetic flux guides and magnetoresistive sensor units. The calibration coils and the initialization coils generate a calibration magnetic field paralleled the direction of pinned layer and a uniform initialization magnetic field in the direction of the free layer respectively at the location of the magnetoresistive sensor units. Through controlling the current of the calibration coils and the initialization coils, the calibration and initialization of the magnetic state of the single-chip X-axis linear magnetoresistive sensor can be performed.

16 Claims, 12 Drawing Sheets

(58) Field of Classification Search
USPC .......................................................... 324/202
See application file for complete search history.

(56) References Cited

FOREIGN PATENT DOCUMENTS

| | | |
|---|---|---|
| CN | 103412176 | 11/2013 |
| CN | 103414176 | 11/2013 |
| CN | 203337808 | 12/2013 |
| CN | 103645449 | 3/2014 |
| CN | 103913709 | 7/2014 |
| CN | 104698409 | 6/2015 |
| CN | 204462360 | 7/2015 |
| TW | 201317603 | 5/2013 |
| WO | WO-2016124135 | 8/2016 |

* cited by examiner

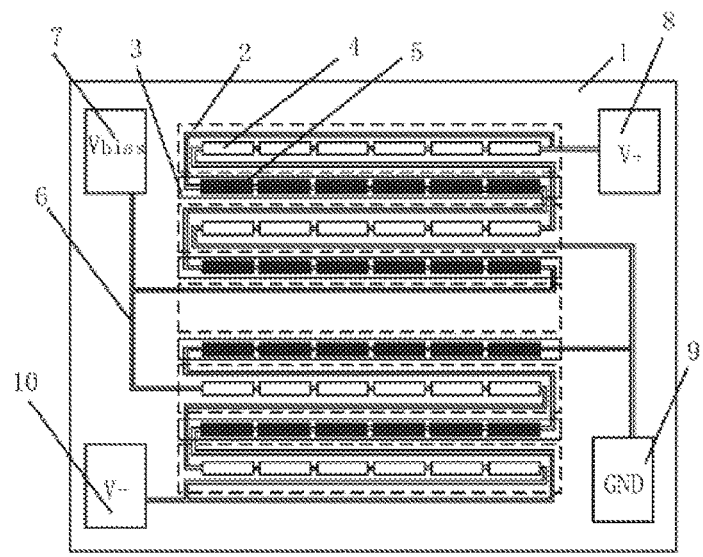
FIG. 1 --PRIOR ART--
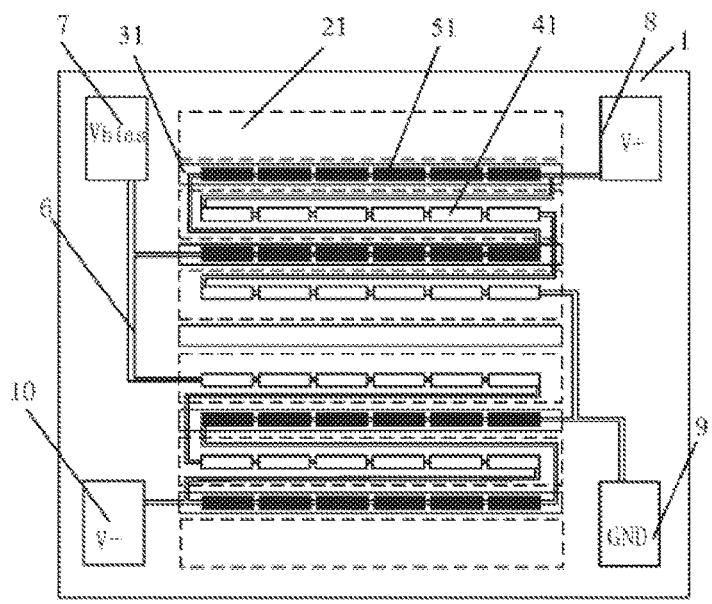
FIG. 2 --PRIOR ART--

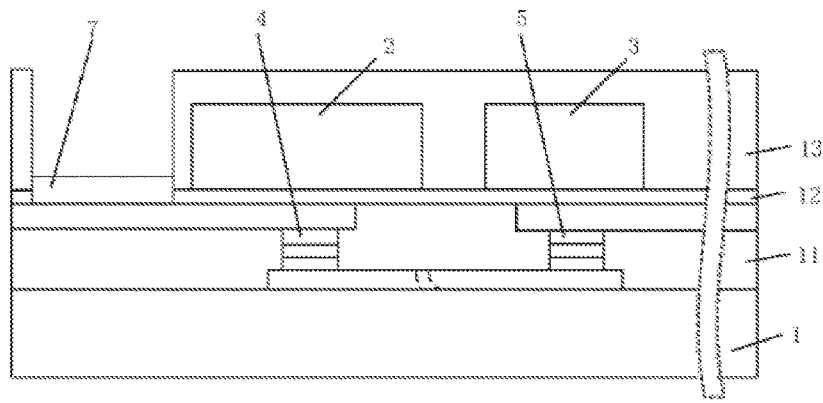
FIG. 3 --PRIOR ART--
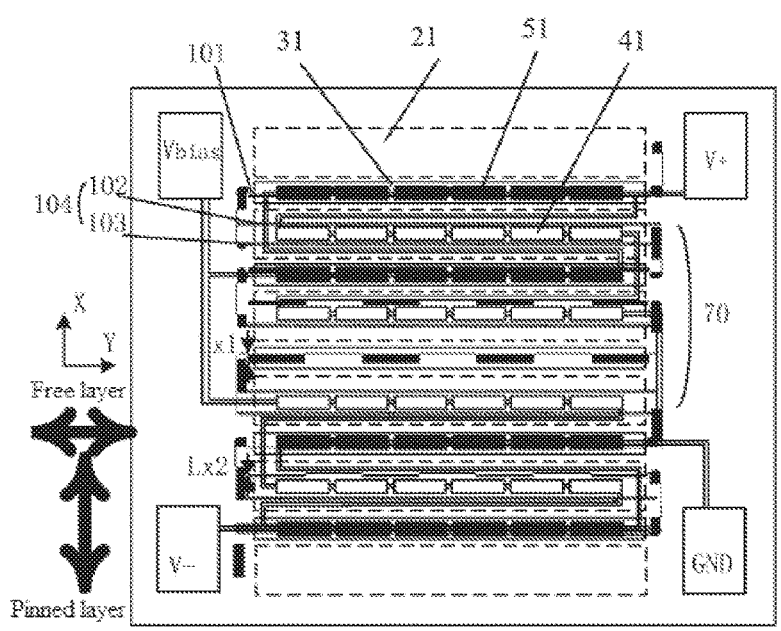
FIG. 4

SINGLE-CHIP HIGH-MAGNETIC-FIELD X-AXIS LINEAR MAGNETORESISTIVE SENSOR WITH CALIBRATION AND INITIALIZATION COIL

PRIORITY CLAIM TO RELATED APPLICATIONS

This application is a U.S. national stage application filed under 35 U.S.C. § 371 from International Application Serial No. PCT/CN2016/073244, which was filed 3 Feb. 2016, and published as WO2016/124135 on 11 Aug. 2016, and which claims priority to Chinese Application No. 201510056576.4, filed 4 Feb. 2015, which applications and publication are incorporated by reference as if reproduced herein and made a part hereof in their entirety, and the benefit of priority of each of which is claimed herein.

TECHNICAL FIELD

The present invention relates to the field of magnetic sensors, and in particular, to a single-chip high-magnetic-field X-axis linear magnetoresistive sensor with a calibration and an initialization coil.

BACKGROUND ART

Silicon magnetic sensors mainly include Hall sensors, AMR sensors, and GMR sensors. With respect to the Hall sensor, a semiconductor film, such as indium telluride, is deposited on a substrate and the path of a carriers is deflected by an external magnetic field in order to provide different resistances. The advantage thereof is the Hall sensor can measure a relatively wide range of magnetic fields, but a disadvantage thereof is the sensor has low magnetic field sensitivity, and it is generally necessary to introduce a flux concentrator to amplify an external magnetic field. With respect to AMR sensors, a single-layer magnetic film is deposited on a substrate, and the magnetic moment direction of the magnetic film is changed in response to an external magnetic field, thus changing the resistance measured across the ends. Sensor units and electrodes thereof patterned into a slanted bar shape, such that a desired angle is formed between the current direction and the magnetic field direction, when doing so the magnetic field direction can be detected. The advantage is the sensor units are simple and only have one layer of film, but a disadvantage is the sensor has a relatively low magnetoresistance and thus poor sensitivity. A GMR multi-layer film magnetic sensor is a magnetoresistive sensor formed by a nanometer-thick multi-layer film structure composed of ferromagnetic films and conductive films, which changes the resistance in response to a relative change of the magnetization direction of the magnetic film layers producing a change in the path that the electric carrier must travel through the magnetic field when the carrier passes through the multi-layer film. This provides a further improvement in magnetoresistive relative to an AMR sensor.

Compared with the above technology, a TMR sensor changes the relative percentage of up/down electron spins introduced in the ferromagnetic layers respectively, these layers are a ferromagnetic pinned layer, separated by a non-metallic insulating layer, from the ferromagnetic free layer, and by designing the free layer such that the magnetization direction of the free layer moves proportionally in response to an external magnetic field. Then the current that tunnels between the ferromagnetic free layer and the reference layer changes, resulting in a change of resistance of the sensor. The magnetoresistive change magnitude thereof may exceed 200%, which is much higher than that of the Hall, AMR or GMR type magnetoresistive sensor.

At present, silicon magnetic three-axis linear magnetoresistive sensors are widely used in consumer electronics, for example, mobile phones, tablet computers, and other electronic products. A three-axis linear magnetoresistive sensor includes an X-axis linear magnetoresistive sensor, a Y-axis linear magnetoresistive sensor, and a Z-axis linear magnetoresistive sensor. These sensors are mostly Hall, AMR or GMR sensors.

Therefore, in order to expand the application field and range of TMR magnetoresistive sensors, the present invention proposes a single-chip high-magnetic-field X-axis linear magnetoresistive sensor with a calibration and an initialization coil, which has excellent linear range and magnetic field sensitivity, and is fully qualified as a replacement of the present Hall, AMR, or GMR type X-axis linear magnetoresistive sensor.

SUMMARY OF THE INVENTION

The present invention proposes a single-chip high-magnetic-field X-axis linear magnetoresistive sensor with a calibration and an initialization coil. A calibration and an initialization coil are introduced onto a chip, a suitable current passes through the calibration coil, a calibration magnetic field is generated along an X direction respectively at positions of a magnetoresistive sensing unit string and a reference magnetoresistive unit string, and precise regulation on the magnitude of the calibration magnetic field is achieved by regulating a calibration current. Because the calibration coil is located on the X-axis sensor chip, during measurement, only a quick measurement is required while applying the calibration current, thus improving the efficiency precision of the measurement.

Similarly, when irreversible changes of magnetization state occur in the X-axis magnetoresistive sensor under the action of an external magnetic field, a current may be introduced into the initialization coil, external magnetic fields along initial magnetization directions of free layers are generated at the locations of all the magnetoresistive sensor units, thus restoring magnetization states of the free layers, to eliminate historical influences on the magnetization states of soft magnetic films due to the effect of the magnetic field.

The present invention proposes a single-chip high-magnetic-field X-axis linear magnetoresistive sensor with a calibration and an initialization coil, including a high magnetic field single-chip referenced bridge X-axis magnetoresistive sensor, a calibration coil, and an initialization coil;

Wherein the high magnetic field single-chip referenced bridge X-axis magnetoresistive sensor includes a reference magnetoresistive sensor unit string and a sensing magnetoresistive sensor unit string staggered above a substrate, and elongated soft ferromagnetic flux guides, the soft ferromagnetic flux guides each include a shielding device and an attenuator, the reference magnetoresistive sensor unit string and the sensing magnetoresistive sensor unit string are located at positions of Y-axis center lines on surfaces of the shielding devices and the attenuators respectively, the reference magnetoresistive sensor unit string and the sensing magnetoresistive sensor unit string are electrically connected to form a referenced bridge structure, a sensing direction is the X-axis direction, and the reference magnetoresistive sensor unit string and the sensing magnetoresistive sensor unit string both include multiple magnetoresistive units; the calibration coils are planar coils and include reference unit straight wires and sensing unit straight wires which are parallel and connected in series and respectively correspond to the reference magnetoresistive sensor unit string and the sensing magnetoresistive sensor unit string, and the two groups of straight wires generate a reference unit calibration magnetic field and a sensing unit calibration magnetic field respectively along the sensing directions of the magnetoresistive sensor units at the positions of the reference magnetoresistive sensor unit string and the sensing magnetoresistive sensor unit string; and The initialization coils include multiple initialization straight wires perpendicular to the sensing magnetoresistive sensor unit string and the reference magnetoresistive sensor unit string, and generate a same initialization magnetic field along a direction perpendicular to the sensing directions at the locations of all the magnetoresistive sensor unit strings.

During calibration, a calibration current passes through the calibration coil, such that an X-direction sensing unit calibration magnetic field and a reference unit calibration magnetic field are generated respectively at the locations of the sensing magnetoresistive sensor unit string and the reference magnetoresistive sensor unit string, and a calibration function is performed by measuring an output signal of the X-axis magnetoresistive sensor; during initialization, an initialization current passes through the initialization coil, and an initialization magnetic field is generated along a Y direction at the location of each magnetoresistive sensor unit, thus restoring the magnetic state of the magnetoresistive sensor units.

The sensing unit straight wires of the calibration coils have an elongated shape, have a width of Lx1, and are symmetric relative to the Y-axis center lines of the attenuators; each of the reference unit straight wires of the calibration coils includes two straight sub-wires connected in parallel, the straight sub-wires have an elongated shape and have a width of Lx2, the two straight sub-wires are symmetrically distributed on two sides of the reference magnetoresistive sensor unit string, wherein Lx2 is less than Lx1, and the reference unit straight wires and the sensing unit straight wires are connected in series.

Preferably, the sensing unit straight wires of the calibration coils have an elongated shape, have a width of Lx1, and are symmetric relative to the Y-axis center lines of the attenuators; the reference unit straight wires of the calibration coils have an elongated shape, have a width of Lx2, and are symmetric relative to the Y-axis center lines of the shielding devices, wherein Lx1 is less than Lx2, and the reference unit straight wires and the sensing unit straight wires are connected in series.

Preferably, the reference unit straight wires and the sensing unit straight wires of the calibration coils are all located at gaps between adjacent shielding devices and attenuators, wherein the reference unit straight wires are located at one side close to the shielding devices, the sensing unit straight wires are located at one side close to the attenuators, the sensing unit straight wires and the reference unit straight wires are all in an elongated shape and have widths of Lx1 and Lx2 respectively, wherein Lx1 is less than Lx2, and the reference unit straight wires and the sensing unit straight wires are connected in series.

A magnetic field ratio of the calibration coil generated along the sensing directions at the locations of the sensing magnetoresistive sensor unit string and the reference magnetoresistive sensor unit string is close to or greater than a magnetic field ratio of the X external magnetic field along the sensing directions at the locations of the sensing magnetoresistive sensor unit string and the reference magnetoresistive sensor unit string.

The calibration coils are placed above the substrate and below the magnetoresistive sensor units, or placed between the magnetoresistive sensor units and the soft ferromagnetic flux guides, or placed above the soft ferromagnetic flux guides.

Preferably, the calibration coils are placed above the substrate and below the magnetoresistive sensor units, or placed between the magnetoresistive sensor units and the soft ferromagnetic flux guides, or placed above the magnetoresistive sensor units and at gaps between the shielding devices and the attenuators of the soft ferromagnetic flux guides.

The initialization coils are planar initialization coils, and the initialization straight wires are located directly above or directly below magnetoresistive sensor unit strings of a magnetoresistive sensor unit array which are arranged along the X-axis direction.

The initialization coils are three-dimensional initialization coils and include top straight wires and bottom straight wires perpendicular to the Y-axis center lines, the top straight wires and the bottom straight wires are connected in series to form three-dimensional coils, the three-dimensional coils are wound around the soft ferromagnetic flux guides and the magnetoresistive sensor units, and the top straight wires and the bottom straight wires are arranged on surfaces of the soft ferromagnetic flux guides and the magnetoresistive sensor units respectively at a same interval.

The planar initialization coils may be placed above the substrate and below the magnetoresistive sensor units, or placed between the magnetoresistive sensor units and the soft ferromagnetic flux guides, or placed above the soft ferromagnetic flux guides.

The initialization coils and the calibration coils are made of a high conductivity material, such as Cu, Au or Ag.

The initialization coils and/or the calibration coils are insulated from the high magnetic field single-chip referenced bridge X-axis magnetoresistive sensor by an insulating material, and the insulating material is $SiO_2$, $Al_2O_3$, $Si_3N_4$, polyimide or photoresist.

The calibration coil includes a positive port and a negative port, and when a current passes through the two ports, an amplitude range of a calibration magnetic field generated by the calibration coil is within a linear working zone of the magnetoresistive sensor units.

The calibration current may be set as a current value or multiple current values.

The initialization coil includes two ports, and when a current passes through the two ports, the magnitude of the initialization magnetic field generated by the initialization coil is higher than a value of a saturated magnetic field of the magnetoresistive sensor units.

The initialization current may be a pulse current or a DC current.

BRIEF DESCRIPTION OF THE DRAWINGS

FIG. 1 is a first structural diagram of a high magnetic field single-chip referenced bridge X-axis magnetoresistive sensor;

FIG. 2 is a second structural diagram of a high magnetic field single-chip referenced bridge X-axis magnetoresistive sensor;

FIG. 3 is a sectional structural diagram of a high magnetic field single-chip referenced bridge X-axis magnetoresistive sensor;

FIG. 4 is a structural diagram of a high-magnetic-field X-axis linear magnetoresistive sensor including planar calibration coils of a first type;

DETAILED DESCRIPTION

Figure 5:
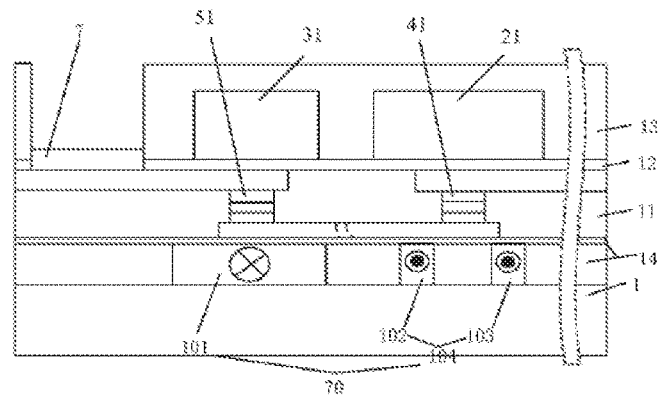
FIG. 5 is a first sectional view of a high-magnetic-field X-axis linear magnetoresistive sensor including planar calibration coils of a first type.

Chinese patent 201310719255.9 discloses a single-chip referenced bridge magnetic sensor for a high magnetic field, which, as shown in FIG. 1 and FIG. 2, includes a substrate 1, reference magnetoresistive sensor unit strings 4 and 41 placed above the substrate, sensing magnetoresistive sensor unit strings 5 and 51, and soft ferromagnetic flux guides. The soft ferromagnetic flux guides include shielding devices 2 and 21 corresponding to the reference magnetoresistive sensor unit strings 4 and 41 respectively and attenuators 3 and 31 corresponding to the sensing magnetoresistive sensor unit strings 5 and 51 respectively. The reference magnetoresistive sensor unit strings and the sensing magnetoresistive sensor unit strings are electrically connected to form a referenced bridge structure, and are connected via a wire 6, wherein ports include a power supply terminal 7, a ground terminal 9, and signal output terminals 8 and 10. FIG. 1 and FIG. 2 are different in that the reference magnetoresistive sensor unit strings and the sensing magnetoresistive sensor unit strings are arranged in different orders, wherein in FIG. 1, two middle sensing magnetoresistive sensor units are adjacent to each other, and two reference magnetoresistive sensor units are located on two sides correspondingly, while in FIG. 2, two middle reference magnetoresistive sensor unit strings are adjacent to each other, and two sensing magnetoresistive sensor unit strings are located on two sides correspondingly, wherein the reference magnetoresistive sensor unit strings and the sensing magnetoresistive sensor unit strings are placed on Y-axis center lines of the shielding devices and the attenuators corresponding thereto, and the magnetic field sensing directions of the magnetoresistive sensor unit strings are X-axis directions. The principle thereof is as follows: under the action of an external magnetic field in the X-axis direction, a magnetic field component attenuation factor generated at the reference magnetoresistive sensor unit strings is significantly great, and because the shielding devices have a relatively great width, the width amplitude thereof is much greater than the width of the reference magnetoresistive sensor unit strings. On the other hand, the magnetic field component attenuation amplitude generated at the sensing magnetoresistive sensor unit strings is relatively small, and because the attenuators have a relatively small width, the width amplitude thereof is close to the width of the sensing magnetoresistive sensor unit strings. Therefore, although the magnetoresistive sensor unit strings have a relatively low measurable magnetic field value, because the attenuators are capable of attenuating an external magnetic field much greater than the measurable magnetic field value to a measurable magnetic field range, and the shielding devices can attenuate the external magnetic field to a range much less than the measurable magnetic field amplitude, a referenced bridge high-magnetic-field measurement X-axis magnetic field sensor is formed.

FIG. 3 is a sectional view of a high magnetic field single-chip referenced bridge X-axis magnetic sensor, which sequentially includes, from bottom up, a substrate 1, magnetoresistive units including a reference magnetoresistive sensor unit string 4 and a sensing magnetoresistive sensor unit string 5, and soft ferromagnetic flux guides, i.e., a shielding device 2 located on a surface of the reference magnetoresistive sensor unit string 4 and an attenuator 3 located on a surface of the sensing magnetoresistive sensor unit string 5, and in addition, further includes an insulating material layer 11 for isolation between the substrate 1 and the magnetoresistive sensor units, an insulating material layer 12 between the soft ferromagnetic flux guides and the magnetoresistive sensor units, and an insulating material 13 that covers a surface layer. In addition, 7 denotes the four electrodes.

In FIG. 1 and FIG. 2, the magnetoresistive sensor unit strings in the single-chip referenced bridge magnetic sensor for a high magnetic field are TMR magnetoresistive sensor units, including a free layer, a pinned layer and a middle barrier layer. An initial magnetization direction of the free layer thereof is a Y direction, and a magnetization direction of the pinned layer, namely, a magnetic field sensing direction, is an X direction. The above single-chip X-axis magnetoresistive sensor can achieve measurement on external magnetic field components from the X axis, but has the following problems:

1) at a wafer testing stage, it is necessary to design a complicated X-direction external magnetic field generation system, including an electromagnetic coil and an electromagnetic coil power supply, and an electromagnetic coil system needs to move together with a probe platform, thus increasing the cost of measurement and affecting the efficiency of measurement;

2) inaccuracy issues exist in the application and positioning of the magnetic field of the electromagnetic coil system, thus affecting the precision of measurement; and 3) due to the existence of a magnetic domain in the soft magnetic film of the free layer, under the action of the external magnetic field, the movement of a domain wall is irreversible; as a result, after the removal of the external magnetic field, the magnetic film of the free layer cannot restore to the initial state, and hysteresis is caused, so that it is difficult to guarantee repeatability of measurement of the sensor.

The present invention is described below in detail with reference to the accompanying drawings and in combination with embodiments.

For the sake of convenience, arrangement types and features of the calibration coils and the initialization coils on the chip are described in the following by taking the high magnetic field single-chip referenced bridge X-axis magnetoresistive sensor in FIG. 2 as an example, and the results thereof are also applicable to the high magnetic field single-chip referenced bridge X-axis magnetoresistive sensor shown in FIG. 1.

Embodiment 1

FIG. 4 is a diagram of structure and distribution of a first type of calibration coils 70. The calibration coils 70 are planar coils, including elongated sensing unit straight wires 101 and reference unit straight wires 104 connected in series. The sensing unit straight wires 101 have a width of Lx1, and Y-axis center lines thereof are arranged along a sensing magnetoresistive sensor unit string 51. Each of the reference unit straight wires 104 includes two straight sub-wires 102 and 103. The straight sub-wires 102 and 103 are connected in parallel and are symmetrically distributed, along the Y direction, on two sides of the reference magnetoresistive sensor unit string 41. The straight sub-wires 102 and 103 both have a width of Lx2.

Figure 6:
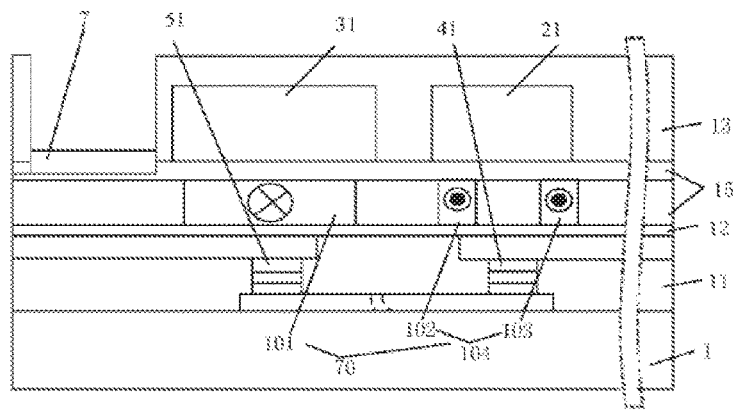
FIG. 6 is a second sectional view of a high-magnetic-field X-axis linear magnetoresistive sensor including planar calibration coils of a first type.
Figure 7:
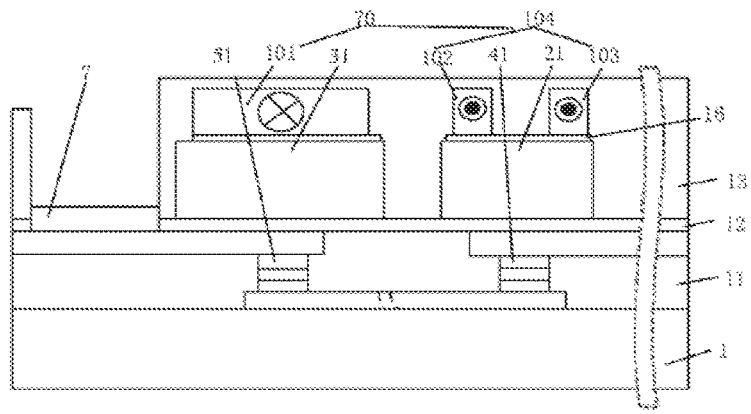
FIG. 7 is a third sectional view of a high-magnetic-field X-axis linear magnetoresistive sensor including planar calibration coils of a first type.

FIGS. 5-7 are sectional views of an X-axis magnetoresistive sensor including a first type of calibration coils 70 shown in FIG. 4 respectively. In FIG. 5, the planar calibration coils are placed above the substrate 1 and below the magnetoresistive sensor units, wherein the sensing unit straight wires 101 are placed below the sensing magnetoresistive sensor unit string 51, the reference unit straight wires 104 include two straight sub-wires 102 and 103 connected in parallel, and 102 and 103 are symmetrically distributed on two sides of the reference magnetoresistive sensor unit string 41.

In FIG. 6, calibration coils of the first type 70 are placed between the magnetoresistive sensor units 41 and 51 and the soft ferromagnetic flux guides 21 and 31. In FIG. 7, calibration coils of the first type 70 are placed above the soft ferromagnetic flux guides 21 and 31. In addition, in order to ensure electrical insulation between calibration coils of the first type 70 and other parts of the X-axis magnetoresistive sensor, insulating material layers 14, 15 and 16 are introduced.

Figure 8:
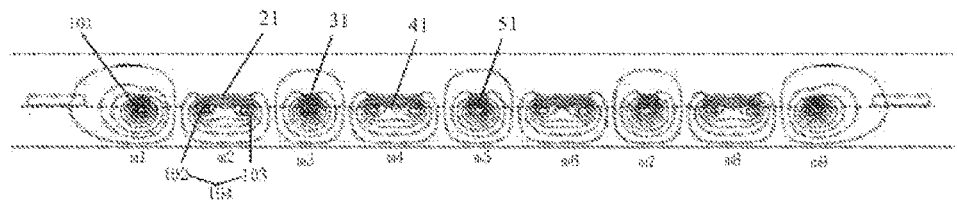
FIG. 8 is a first diagram of magnetic field distribution of planar calibration coils of a first type on a high-magnetic-field X-axis linear magnetoresistive sensor.

FIG. 8 is a diagram of distribution of a magnetic field generated by straight wires 101 corresponding to the attenuators 31 and straight wires 104 corresponding to the shielding devices 21 included in the calibration coils when calibration coils of the first type are placed below the magnetoresistive sensor units 41 and 51 and above the substrate, wherein 104 includes two straight sub-wires 102 and 103 connected in parallel, and m1-m9 correspond to the positions of the magnetoresistive sensors respectively.

Figure 9:
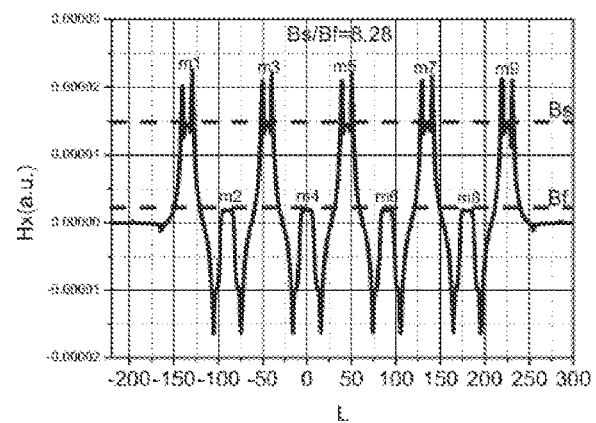
FIG. 9 is a first diagram of X-direction magnetic field distribution of planar calibration coils of a first type at positions of magnetoresistive sensor units of a high-magnetic-field X-axis linear magnetoresistive sensor.

FIG. 9 is a diagram of distribution of X-axis magnetic field components on a straight line corresponding to the magnetoresistive sensor connecting m1-m9 shown in FIG. 8, from which it can be seen that m1, m3, m5, m7 and m9 corresponding to the attenuators have the same magnetic field value, m2, m4, m6 and m8 corresponding to the shielding devices also have the same magnetic field value, the former is much greater than the latter, and Bs/Bf=8.28, wherein Bs is a sensitive magnetic field amplitude value, and Bf is a referenced magnetic field amplitude value.

Figure 10:
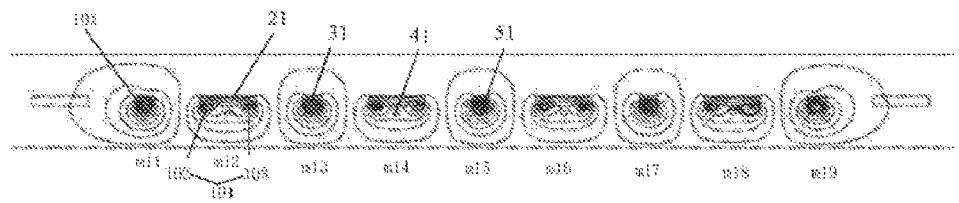
FIG. 10 is a second diagram of magnetic field distribution of planar calibration coils of a first type on a high-magnetic-field X-axis linear magnetoresistive sensor.

FIG. 10 is a diagram of distribution of a magnetic field generated by straight wires 101 corresponding to the attenuators 31 and straight wires 104 corresponding to the shielding devices 21 included in the calibration coils when calibration coils of the first type are placed above the magnetoresistive sensor units 41 and 51 and below the soft ferromagnetic flux guides 21 and 31, wherein 104 includes two straight sub-wires 102 and 103 connected in parallel, and m11-m19 correspond to the positions of the magnetoresistive sensors respectively.

Figure 11:
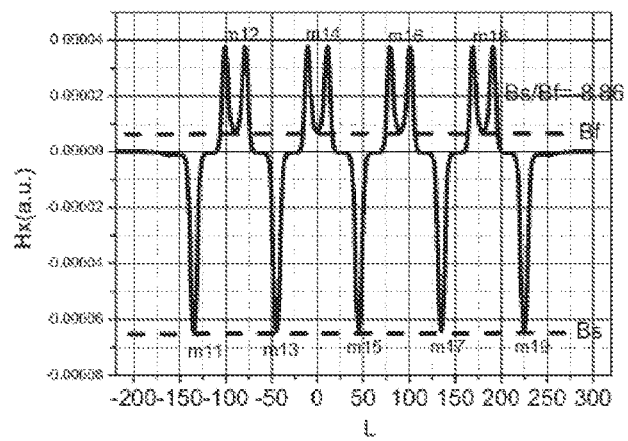
FIG. 11 is a second diagram of X-direction magnetic field distribution of planar calibration coils of a first type at positions of magnetoresistive sensor units of a high-magnetic-field X-axis linear magnetoresistive sensor.

FIG. 11 is a diagram of distribution of X-axis magnetic field components on a straight line corresponding to the magnetoresistive sensor connecting m11-m19 shown in FIG. 10, from which it can be seen that m11, m13, m15, m17 and m19 corresponding to the attenuators have the same magnetic field value, m12, m14, m16 and m18 corresponding to the shielding devices also have the same magnetic field value, the former is much greater than the latter, and Bs/Bf=8.86.

Figure 12:
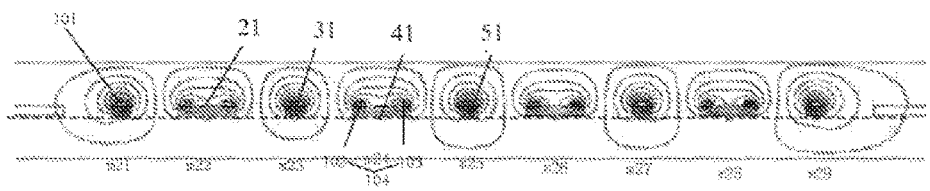
FIG. 12 is a third diagram of magnetic field distribution of planar calibration coils of a first type on a high-magnetic-field X-axis linear magnetoresistive sensor.

FIG. 12 is a diagram of distribution of a magnetic field generated by straight wires 101 corresponding to the attenuators 31 and straight wires 104 corresponding to the shielding devices 21 included in the calibration coils when calibration coils of the first type are placed above the soft ferromagnetic flux guides 21 and 31, wherein 104 includes two straight sub-wires 102 and 103 connected in parallel, and m21-m29 correspond to the positions of the magnetoresistive sensors respectively.

Figure 13:
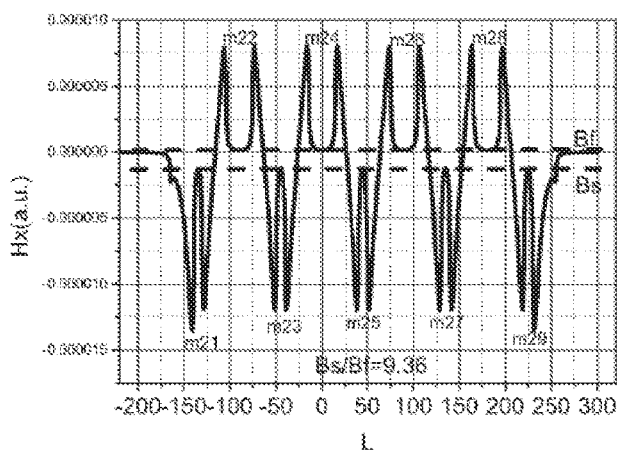
FIG. 13 is a third diagram of X-direction magnetic field distribution of planar calibration coils of a first type at positions of magnetoresistive sensor units of a high-magnetic-field X-axis linear magnetoresistive sensor.

FIG. 13 is a diagram of distribution of X-axis magnetic field components on a straight line corresponding to the magnetoresistive sensor connecting m21-m29 shown in FIG. 12, from which it can be seen that m21, m23, m25, m27 and m29 corresponding to the attenuators have the same magnetic field value, m22, m24, m26 and m28 corresponding to the shielding devices also have the same magnetic field value, and the former is much greater than the latter, but it can also be seen that, due to the shielding effect of the soft ferromagnetic flux guides on the external magnetic field, the attenuators and the shielding devices are all attenuated considerably, especially, the magnetic field amplitude of the attenuator magnetic field is reduced significantly relative to FIG. 10 and FIG. 8, and Bs/Bf=9.36.

Embodiment 2

Figure 14:
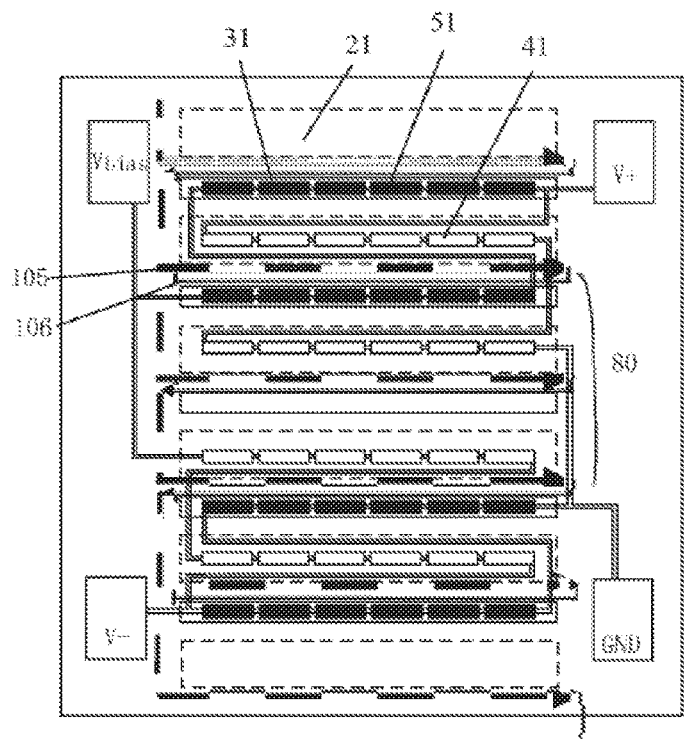
FIG. 14 is a structural diagram of a high-magnetic-field X-axis linear magnetoresistive sensor including planar calibration coils of a second type.

FIG. 14 is a structural diagram of planar calibration coils of a second type 80 on a high magnetic field single-chip X-axis linear magnetoresistive sensor. The second type of planar calibration coils 80 include two straight wires, i.e., a reference unit straight wire 105 and a sensing unit straight wire 106, which are respectively placed at gaps between the shielding device 21 and the attenuator 31. Moreover, the reference unit straight wire 105 has a larger width and is placed on one side close to the shielding device 21. The sensing unit straight wire 106 has a smaller width and is placed on one side close to the attenuator 31, and the sensing unit straight wire 106 and the reference unit straight wire 105 are mutually connected in series.

Figure 15:
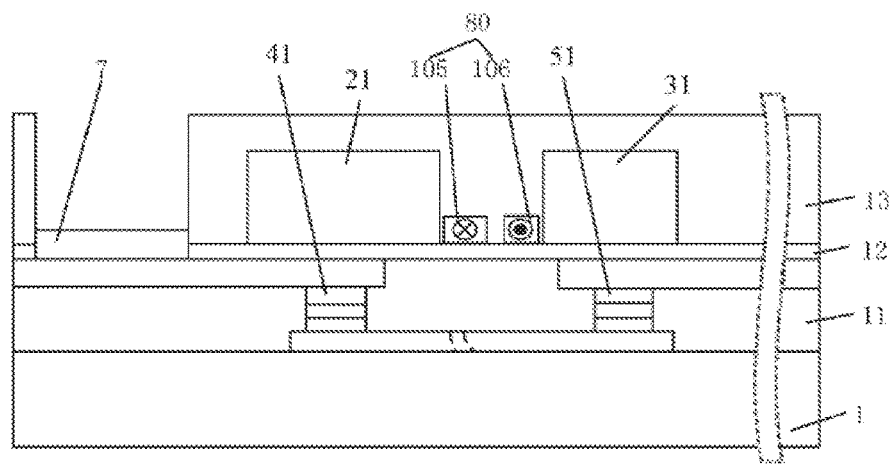
FIG. 15 is a sectional view of a high-magnetic-field X-axis linear magnetoresistive sensor including planar calibration coils of a second type.

FIG. 15 is a sectional view of planar calibration coils of a second type 80 on a high magnetic field single-chip X-axis linear magnetoresistive sensor, wherein the reference unit straight wire 105 and the sensing unit straight wire 106 are placed at a gap between the attenuator 31 and the shielding device 21, and placed above the magnetoresistive sensor units 41 and 51.

Figure 16:
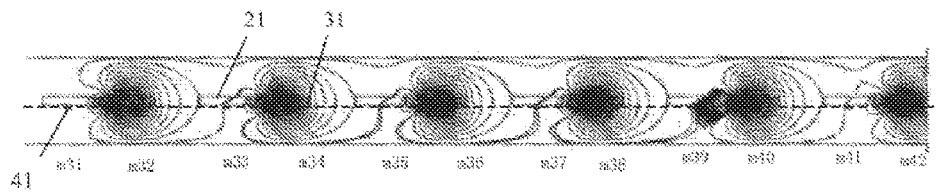
FIG. 16 is a diagram of magnetic field distribution of planar calibration coils of a second type on a high-magnetic-field X-axis linear magnetoresistive sensor.
Figure 17:
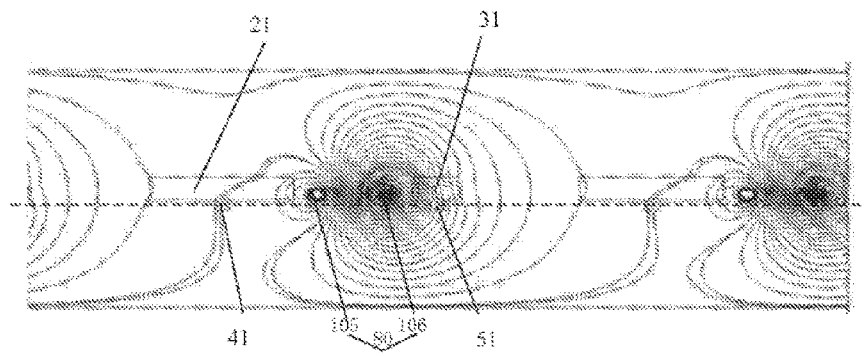
FIG. 17 is a second diagram of magnetic field distribution of planar calibration coils of a second type on a high-magnetic-field X-axis linear magnetoresistive sensor.
Figure 18:
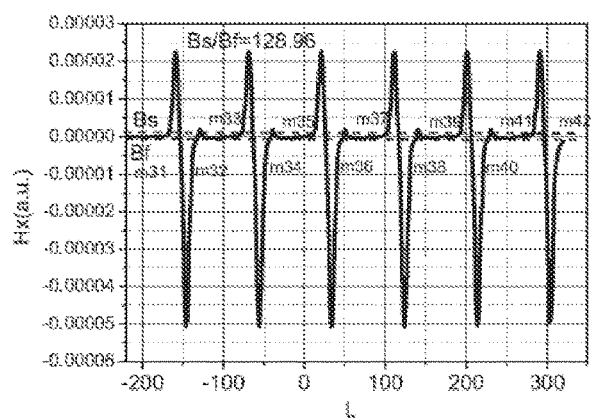
FIG. 18 is a diagram of X-direction magnetic field distribution of planar calibration coils of a second type at positions of magnetoresistive sensor units of a high-magnetic-field X-axis linear magnetoresistive sensor.

FIG. 16 is a diagram of magnetic field distribution during the operation of planar calibration coils of a second type 80, from which relative position relationships of a total of 12 magnetoresistive sensor units m31-m42 at the reference unit straight wire and the sensing unit straight wire and magnetic field distribution thereof can be seen. FIG. 17 is a diagram of distribution of a magnetic field at the locations of a reference magnetoresistive sensor unit and a sensing magnetoresistive sensor unit in FIG. 16. The magnetic field intensity at the sensing magnetoresistive sensor unit 51 is evidently stronger than that at the reference magnetoresistive sensor unit 41, and the diagram of distribution of X-direction magnetic field components thereof is as shown in FIG. 18, wherein the X-direction magnetic field at the location of the reference magnetoresistive sensor unit is close to 0, while the X-direction magnetic field at the sensing magnetoresistive sensor unit has a projection, wherein Bs/Bf=128.96.

For ease of description, this solution only provides a situation where the second type of planar calibration coils 80 are placed above the magnetoresistive sensor units 41 and 51 and between the attenuator 21 and the shielding device 31 that are adjacent to each other. In fact, the second type of planar calibration coils 80 may also be placed above the substrate and below the magnetoresistive sensor units, or placed above the magnetoresistive sensor units and below the soft ferromagnetic flux guides.

Embodiment 3

Figure 19:
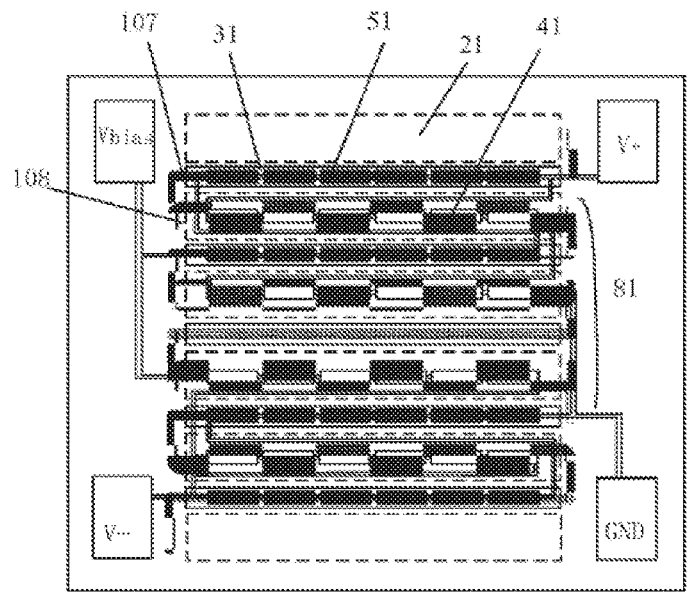
FIG. 19 is a structural diagram of a high-magnetic-field X-axis linear magnetoresistive sensor including planar calibration coils of a third type.

FIG. 19 is a diagram of distribution of planar calibration coils of a third type 81 on a high magnetic field single-chip X-axis magnetoresistive sensor. The third type of planar calibration coils 81 include a sensing unit straight wire 107 and a reference unit straight wire 108 connected in series, wherein the reference unit straight wire 108 corresponds to the shielding device 21, the sensing unit straight wire 107 corresponds to the attenuator 31, the reference unit straight wire 108 and the sensing unit straight wire 107 are both elongated, which coincide with Y-axis center lines of the attenuator 31 and the shielding device 21 respectively, and the width of the sensing unit straight wire 107 is less than that of the reference unit straight wire 108.

Figure 20:
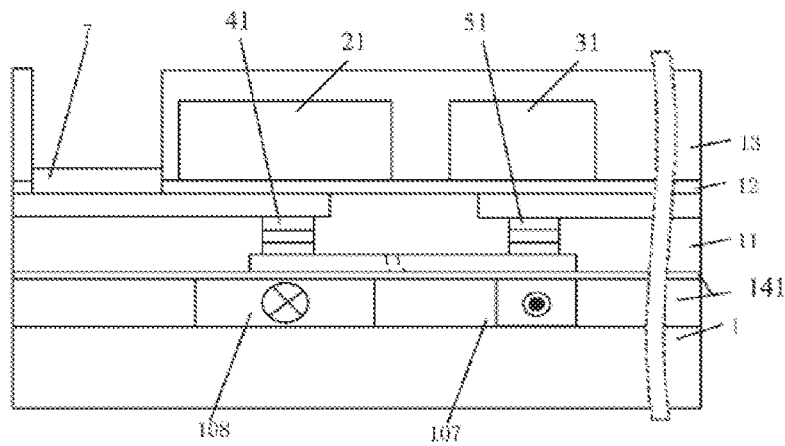
FIG. 20 is a sectional view of a high-magnetic-field X-axis linear magnetoresistive sensor including planar calibration coils of a third type.

FIG. 20 is a sectional view of planar calibration coils of a third type 81 on a high magnetic field single-chip X-axis magnetoresistive sensor. The reference unit straight wire 108 and the sensing unit straight wire 107 are placed below a reference magnetoresistive sensor unit string 41 and a sensing magnetoresistive sensor unit string 51 respectively. It needs to be indicated that this example only provides one situation for ease of description, and in fact, the third type of planar calibration coils 81 may also be placed between the magnetoresistive sensor units and the soft ferromagnetic flux guides, or placed above the soft ferromagnetic flux guides. In addition, in order to ensure electrical insulation between the third type of planar calibration coils 81 and the magnetoresistive sensor units 41 and 51, an insulating layer 141 is introduced.

Figure 21:
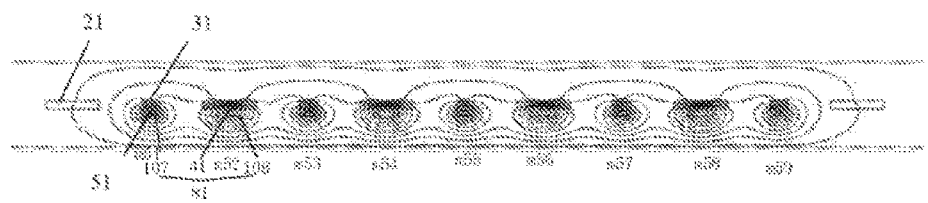
FIG. 21 is a diagram of magnetic field distribution of planar calibration coils of a third type on a high-magnetic-field X-axis linear magnetoresistive sensor.
Figure 22:
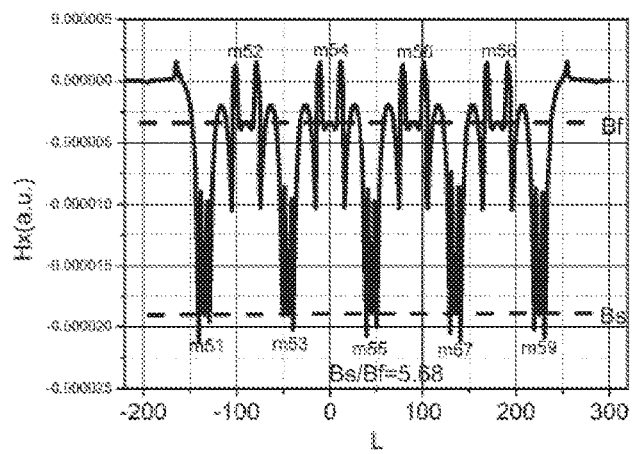
FIG. 22 is a diagram of X-direction magnetic field distribution of planar calibration coils of a third type at positions of magnetoresistive sensor units of a high-magnetic-field X-axis linear magnetoresistive sensor.

FIG. 21 is a diagram of distribution of a magnetic field generated by planar calibration coils of a third type 81 on a high magnetic field single-chip X-axis magnetoresistive sensor, wherein m51-m59 respectively represent a diagram of distribution of X-axis magnetic fields at the locations of the reference magnetoresistive sensor units and the sensing magnetoresistive sensor units, wherein X magnetic field distribution values thereof are as shown in FIG. 22. It can be seen that the X-direction magnetic field components at the reference magnetoresistive sensor units are very small, while the X-direction magnetic field components at the sensing magnetoresistive sensor units increase evidently, wherein Bs/Bf=5.68.

Embodiment 4

Figure 23:
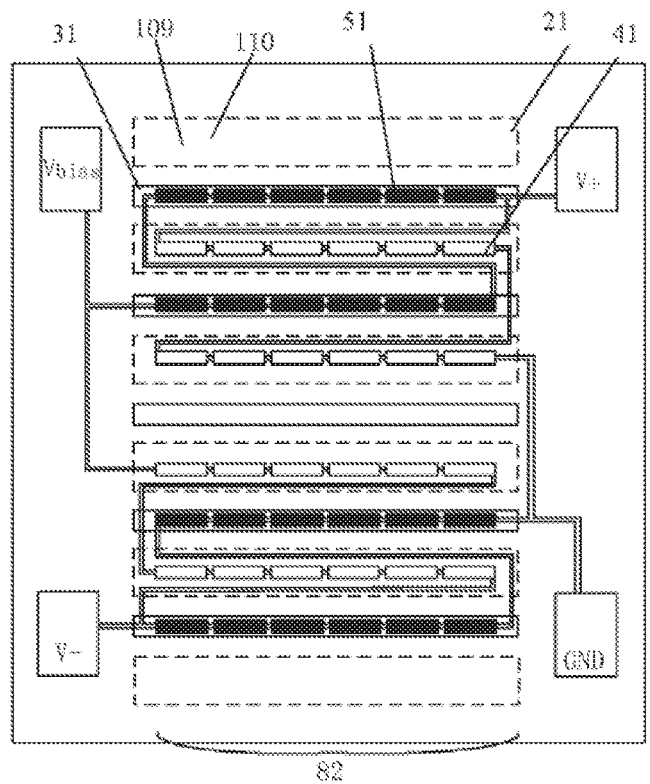
FIG. 23 is a structural diagram of a high-magnetic-field X-axis linear magnetoresistive sensor including planar initialization coils.

FIG. 23 is a diagram of distribution of planar initialization coils 82 on a single-chip high-magnetic-field X-axis magnetoresistive sensor, including two types of straight wires 109 and 110 connected in series. The straight wires are perpendicular to the Y-axis center lines, wherein the straight wires 109 are placed directly above or directly below magnetoresistive sensor unit rows of a magnetoresistive sensor unit array which are along an X direction, while the straight wires 110 are placed at gaps between two adjacent magnetoresistive sensor unit rows or positions on two outer sides of the magnetoresistive sensor unit rows.

Figure 24:
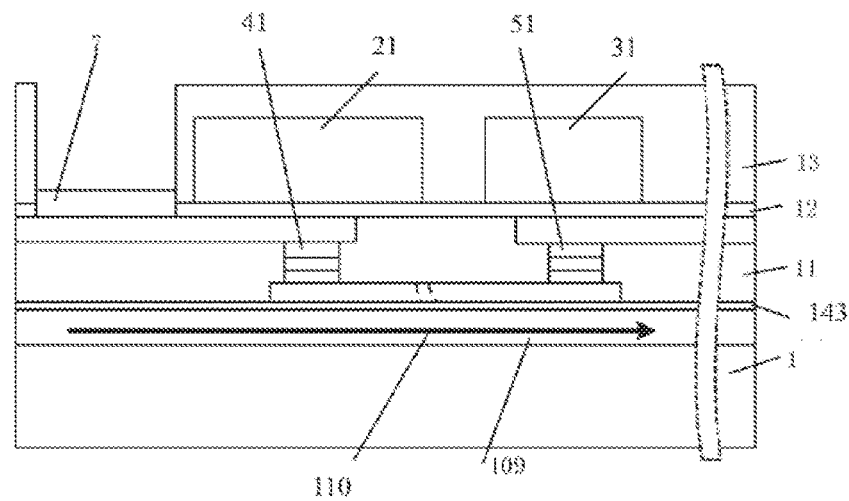
FIG. 24 is a sectional view of a high-magnetic-field X-axis linear magnetoresistive sensor including planar initialization coils.

FIG. 24 is a sectional view of planar initialization coils 82 on a single-chip high-magnetic-field X-axis magnetoresistive sensor. The planar initialization coils are placed above the substrate and below the magnetoresistive sensor units. For ease of description, this example only provides one situation. During actual implementation, the planar initialization coils 82 may also be placed between the magnetoresistive sensor units and the soft ferromagnetic flux guides, or placed above the soft ferromagnetic flux guides. In addition, in order to ensure electrical insulation between the planar initialization coils 82 and the magnetoresistive sensor units 41 and 51, an insulating material 143 is introduced.

Figure 25:
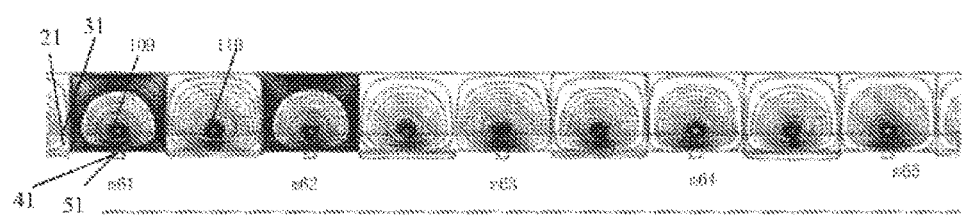
FIG. 25 is a diagram of magnetic field distribution of planar initialization coils on a high-magnetic-field X-axis linear magnetoresistive sensor.
Figure 26:
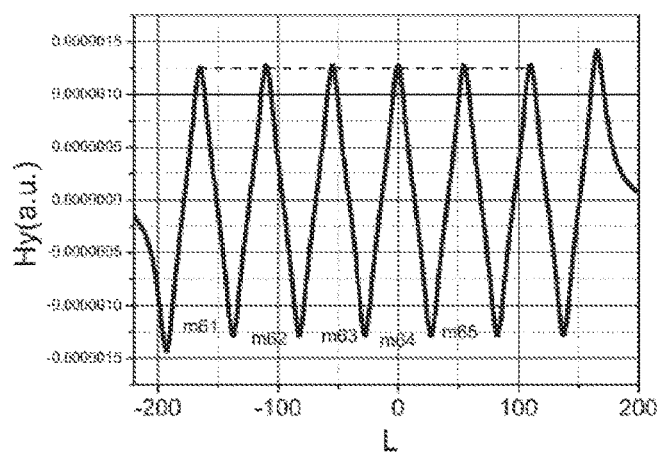
FIG. 26 is a diagram of Y-direction magnetic field distribution of planar initialization coils at positions of magnetoresistive sensor units of a high-magnetic-field X-axis linear magnetoresistive sensor.

FIG. 25 is a diagram of magnetic field distribution of planar initialization coils 82 on a single-chip high-magnetic-field X-axis magnetoresistive sensor. The magnetoresistive sensor units m61-m65 are located on the surface of the attenuator 21 or the shielding device 31, and a curve of distribution of X-direction magnetic field thereof is as shown in FIG. 26. It can be seen from FIG. 24 that the positions of the magnetoresistive sensor units m61-m65 have the same Y-direction magnetic field component.

Embodiment 5

Figure 27:
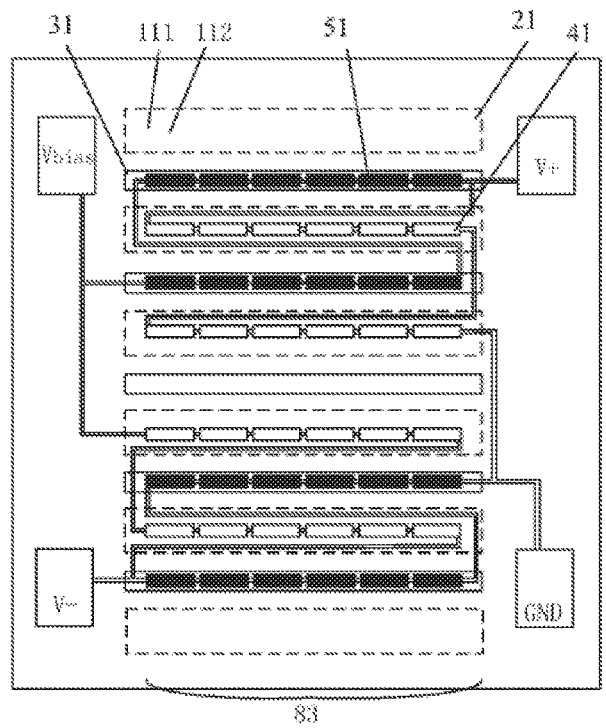
FIG. 27 is a structural diagram of a high-magnetic-field X-axis linear magnetoresistive sensor including three-dimensional initialization coils.

FIG. 27 is a diagram of distribution of three-dimensional initialization coils 83 on a single-chip high-magnetic-field X-axis magnetoresistive sensor, including straight wires perpendicular to the Y-axis center lines, and including top straight wires 111 and bottom straight wires 112. The top straight wires 111 and the bottom straight wires 112 form a three-dimensional solenoid coil structure, the soft ferromagnetic flux guides and the magnetoresistive sensor units are taken as a magnetic core, the axis center direction of the three-dimensional solenoid coil structure is taken as a Y direction, and the same spacing is provided between the top straight wires 111 and between the bottom straight wires 112.

Figure 28:
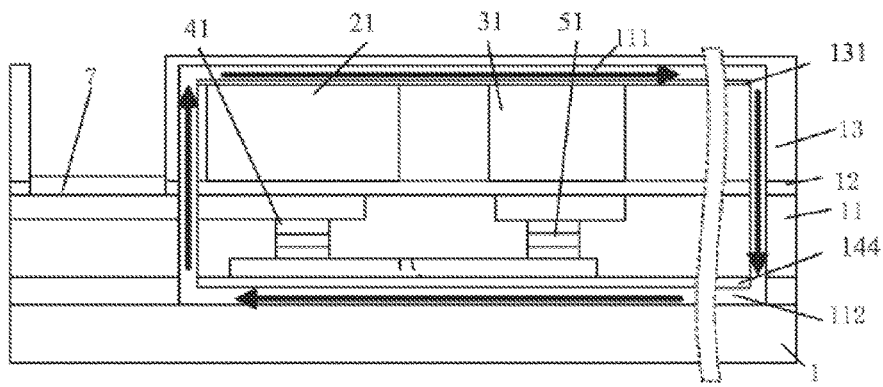
FIG. 28 is a sectional view of a high-magnetic-field X-axis linear magnetoresistive sensor including three-dimensional initialization coils.

FIG. 28 is a sectional view of three-dimensional initialization coils 83 on a single-chip high-magnetic-field X-axis magnetoresistive sensor. The top straight wires 112 of the three-dimensional initialization coils are placed above the soft ferromagnetic flux guides 21 and 31, the bottom straight wires 112 are placed above the substrate and below the magnetoresistive sensor units 41 and 51. In order to ensure electrical insulation between the three-dimensional initialization coils 83 and other parts, insulating material layers 131 and 144 are introduced.

Figure 29:
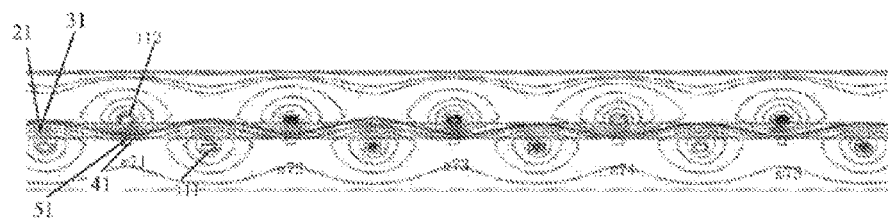
FIG. 29 is a diagram of magnetic field distribution of three-dimensional initialization coils on a high-magnetic-field X-axis linear magnetoresistive sensor.
Figure 30:
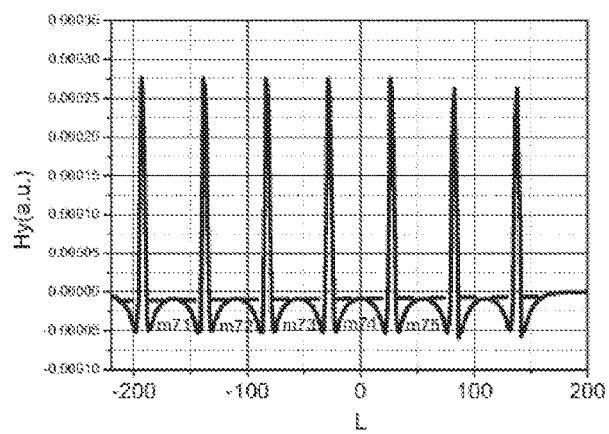
FIG. 30 is a diagram of Y-direction magnetic field distribution of planar initialization coils at positions of magnetoresistive sensor units of a high-magnetic-field X-axis linear magnetoresistive sensor.

FIG. 29 is a diagram of magnetic field distribution of three-dimensional initialization coils 83 on a single-chip high-magnetic-field X-axis magnetoresistive sensor, wherein m71-m75 are respectively distribution of the magnetoresistive sensor units 41 and 51 on the attenuator 21 or the shielding device 31, and corresponding Y-direction magnetic field components are as shown in FIG. 30. It can be seen that the Y-direction magnetic field components have characteristics of periodic distribution, and as long as the top straight wires 111 and the bottom straight wires 112 of the three-dimensional initialization coils 83 have an even spacing and the magnetoresistive sensor units 41 and 51 respectively have equal periodic distribution along the Y direction on the attenuator 21 and the shielding device 31, even distribution features of the Y-direction magnetic field of the magnetoresistive sensor units can be ensured.

Embodiment 6

Figure 31:
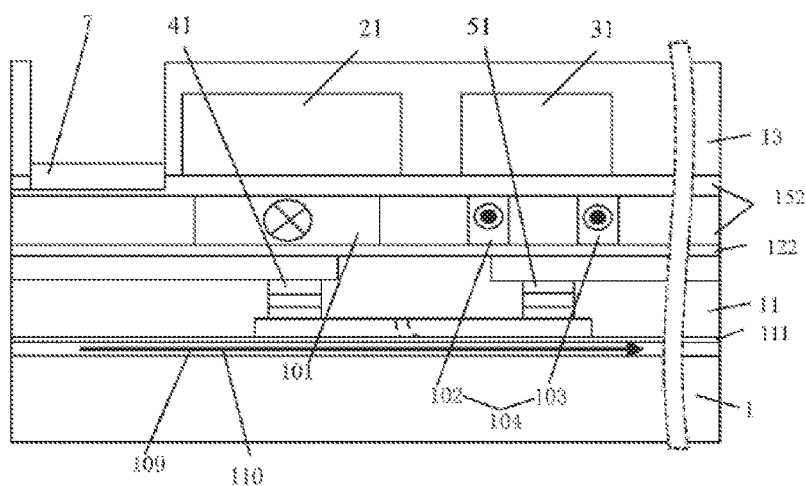
FIG. 31 is a sectional view of a high-magnetic-field X-axis linear magnetoresistive sensor including planar calibration coils and initialization coils.

The above is a single-chip high-magnetic-field X-axis magnetoresistive sensor including a single calibration coil or including a single initialization coil. FIG. 31 shows a single-chip high-magnetic-field X-axis magnetoresistive sensor including a calibration coil and an initialization coil at the same time, wherein the initialization coil is a planar initialization coil and includes initialization straight wires 109 and 110, the calibration coil is a planar coil and includes a reference unit straight wire 101 and a sensing unit straight wire 104, the 101 and 104 are placed above the magnetic sensor units and below the soft ferromagnetic flux guides, and the sensing unit straight wire includes two straight sub-wires 102 and 103. In addition, in order to ensure electrical insulation between the calibration and initialization coils and other parts, insulating material layers 111, 122 and 152 are introduced.

For ease of description, this example only provides a single-chip high-magnetic-field X-axis magnetoresistive sensor including a calibration coil and an initialization coil. In fact, the calibration coil may be any of the first type, the second type and the third type, and the initialization coil may be a planar initialization coil or a three-dimensional initialization coil. In terms of the positions thereof, the calibration coil and the planar initialization coil may be placed above the substrate and below the magnetoresistive sensor unit, or between the magnetoresistive sensor unit and the soft ferromagnetic flux guide, or at any positions above the soft ferromagnetic flux guide, and they are independent of each other; for the calibration coil and the three-dimensional initialization coil, the calibration coil may be placed at the above positions, but the three-dimensional initialization coil has only one circumstance in which the three-dimensional initialization coil is wound by taking the soft ferromagnetic flux guide and the magnetoresistive sensor unit as the center.

The initialization coil and/or the calibration coil are/is insulated from the high magnetic field single-chip referenced bridge X-axis magnetoresistive sensor by using an insulating material. The insulating material is $SiO_2$, $Al_2O_3$, $Si_3N_4$, polyimide or photoresist. The initialization coil and the calibration coil are made of a high conductivity material, such as Cu, Au or Ag.

The invention claimed is:

1. A single-chip high-magnetic-field X-axis linear magnetoresistive sensor with a calibration and an initialization coil, comprising a high magnetic field single-chip referenced bridge X-axis magnetoresistive sensor, a calibration coil, and an initialization coil;

wherein the high magnetic field single-chip referenced bridge X-axis magnetoresistive sensor comprises a reference magnetoresistive sensor unit string and a sensing magnetoresistive sensor unit string staggered above a substrate, and elongated soft ferromagnetic flux guides, the soft ferromagnetic flux guides each comprise a shielding device and an attenuator, the reference magnetoresistive sensor unit string and the sensing magnetoresistive sensor unit string are respectively located at positions of Y-axis center lines on surfaces of the shielding devices and the attenuators respectively, the reference magnetoresistive sensor unit string and the sensing magnetoresistive sensor unit string are electrically connected to form a referenced bridge structure, a sensing direction is an X-axis direction, and the reference magnetoresistive sensor unit string and the sensing magnetoresistive sensor unit string both comprise multiple magnetoresistive units;

wherein the calibration coils are planar coils and comprise reference unit straight wires and sensing unit straight wires which are parallel and connected in series and respectively correspond to the reference magnetoresistive sensor unit string and the sensing magnetoresistive sensor unit string, and the reference unit straight wires and the sensing unit straight wires generate a reference unit calibration magnetic field and a sensing unit calibration magnetic field respectively along the sensing directions of the magnetoresistive sensor units at the positions of the reference magnetoresistive sensor unit string and the sensing magnetoresistive sensor unit string; and wherein the initialization coils comprise multiple initialization straight wires perpendicular to the sensing magnetoresistive sensor unit string and the reference magnetoresistive sensor unit string, and generate a same initialization magnetic field along a direction perpendicular to the sensing directions at the locations of all the magnetoresistive sensor unit strings.

2. The single-chip high-magnetic-field X-axis linear magnetoresistive sensor with the calibration and the initialization coil according to claim 1, wherein the sensing unit straight wires of the calibration coils have an elongated shape, have a width of Lx1, and are symmetric relative to the Y-axis center lines of the attenuators;

wherein each of the reference unit straight wires of the calibration coils comprises two straight sub-wires connected in parallel, the straight sub-wires have an elongated shape and have a width of Lx2, the two straight sub-wires are symmetrically distributed on two sides of the reference magnetoresistive sensor unit string, wherein Lx2 is less than Lx1, and the reference unit straight wires and the sensing unit straight wires are connected in series.

3. The single-chip high-magnetic-field X-axis linear magnetoresistive sensor with the calibration and the initialization coil according to claim 1, wherein the sensing unit straight wires of the calibration coils have an elongated shape, have a width of Lx1, and are symmetric relative to the Y-axis center lines of the attenuators;

wherein the reference unit straight wires have an elongated shape, have a width of Lx2, and are symmetric relative to the Y-axis center lines of the shielding devices, wherein Lx1 is less than Lx2, and the reference unit straight wires and the sensing unit straight wires are connected in series.

4. The single-chip high-magnetic-field X-axis linear magnetoresistive sensor with the calibration and the initialization coil according to claim 1, wherein the reference unit straight wires and the sensing unit straight wires of the calibration coils are all located at gaps between adjacent shielding devices and attenuators, wherein the reference unit straight wires are located at one side close to the shielding devices, the sensing unit straight wires are located at one side close to the attenuators, the sensing unit straight wires and the reference unit straight wires are all in an elongated shape and have widths of Lx1 and Lx2 respectively, wherein Lx1 is less than Lx2, and the reference unit straight wires and the sensing unit straight wires are connected in series.

5. The single-chip high-magnetic-field X-axis linear magnetoresistive sensor with the calibration and the initialization coil according claim 2, wherein a ratio of the sensing unit calibration magnetic field to the reference unit calibration magnetic field is greater than or equal to a magnetic field ratio of an X-axis applied magnetic field along the sensing directions at the locations of the sensing magnetoresistive sensor unit string and the reference magnetoresistive sensor unit string.

6. The single-chip high-magnetic-field X-axis linear magnetoresistive sensor with the calibration and the initialization coil according to claim 2, wherein the calibration coils are placed above the substrate and below the magnetoresistive sensor units, or placed between the magnetoresistive sensor units and the soft ferromagnetic flux guides, or placed above the soft ferromagnetic flux guides.

7. The single-chip high-magnetic-field X-axis linear magnetoresistive sensor with the calibration and the initialization coil according to claim 4, wherein the calibration coils are placed above the substrate and below the magnetoresistive sensor units, or placed between the magnetoresistive sensor units and the soft ferromagnetic flux guides, or placed above the magnetoresistive sensor units and at gaps between the shielding devices and the attenuators of the soft ferromagnetic flux guides.

8. The single-chip high-magnetic-field X-axis linear magnetoresistive sensor with the calibration and the initialization coil according to claim 1, wherein the initialization coils are planar initialization coils, and the initialization straight wires are located directly above or directly below magnetoresistive sensor unit rows of a magnetoresistive sensor unit array which are arranged along the X-axis direction.

9. The single-chip high-magnetic-field X-axis linear magnetoresistive sensor with the calibration and the initialization coil according to claim 1, wherein the initialization coils are three-dimensional initialization coils and comprise top straight wires and bottom straight wires perpendicular to the Y-axis center lines, the top straight wires and the bottom straight wires are connected in series to form three-dimensional coils, the three-dimensional coils are wound around the soft ferromagnetic flux guides and the magnetoresistive sensor units, and the top straight wires and the bottom straight wires are arranged on surfaces of the soft ferromagnetic flux guides and the magnetoresistive sensor units respectively at a same interval.

10. The single-chip high-magnetic-field X-axis linear magnetoresistive sensor with the calibration and the initialization coil according to claim 8, wherein the planar initialization coils are placed above the substrate and below the magnetoresistive sensor units, or placed between the magnetoresistive sensor units and the soft ferromagnetic flux guides, or placed above the soft ferromagnetic flux guides.

11. The single-chip high-magnetic-field X-axis linear magnetoresistive sensor with the calibration and the initialization coil according to claim 1, wherein the initialization coils and the calibration coils are made of a high conductivity material, and the high conductivity material is Cu, Au or Ag.

12. The single-chip high-magnetic-field X-axis linear magnetoresistive sensor with the calibration and the initialization coil according to claim 1, wherein the initialization coils and/or the calibration coils are insulated from the high magnetic field single-chip referenced bridge X-axis magnetoresistive sensor by an insulating material, and the insulating material is SiO2, Al2O3, Si3N4, polyimide or photoresist.

13. The single-chip high-magnetic-field X-axis linear magnetoresistive sensor with the calibration and the initialization coil according to claim 1, wherein the calibration coil comprises a positive port and a negative port, and when a calibration current passes through the two ports, an amplitude range of a calibration magnetic field generated by the calibration coil is within a linear working zone of the magnetoresistive sensor units.

14. The single-chip high-magnetic-field X-axis linear magnetoresistive sensor with the calibration and the initialization coil according to claim 13, wherein the calibration current is one or more set current values.

15. The single-chip high-magnetic-field X-axis linear magnetoresistive sensor with the calibration and the initialization coil according to claim 1, wherein the initialization coil comprises two ports, and when an initialization current passes through the two ports, the magnitude of the initialization magnetic field generated by the initialization coil is higher than a value of a saturated magnetic field of the magnetoresistive sensor units.

16. The single-chip high-magnetic-field X-axis linear magnetoresistive sensor with the calibration and the initialization coil according to claim 15, wherein the initialization current is a pulse current or a DC current.

* * * * *

UNITED STATES PATENT AND TRADEMARK OFFICE
CERTIFICATE OF CORRECTION

PATENT NO. : 10,379,176 B2
APPLICATION NO. : 15/549098
DATED : August 13, 2019
INVENTOR(S) : Deak et al.

Page 1 of 1

It is certified that error appears in the above-identified patent and that said Letters Patent is hereby corrected as shown below:

On the Title Page

In item (71), in "Applicant", in Column 1, Line 2, delete "Zhanjiagang" and insert --Zhangjiagang-- therefor In the Claims In Column 15, Line 2, in Claim 12, delete "SiO2, Al2O3, Si3N4," and insert --$SiO_2$, $Al_2O_3$, $Si_3N_4$,-- therefor Signed and Sealed this
Eighth Day of December, 2020

Andrei Iancu
*Director of the United States Patent and Trademark Office*